*(12)* United States Patent
Koch et al.

(10) Patent No.: US 11,506,893 B2
(45) Date of Patent: Nov. 22, 2022

(54) HEAD-MOUNTED AND HEAD-UP DISPLAYS UTILIZING ORGANIC LIGHT EMITTING DIODES THAT EMIT BY STIMULATED EMISSION

(71) Applicant: RED BANK TECHNOLOGIES LLC, Red Bank, NJ (US)

(72) Inventors: Gene C. Koch, Toms River, NJ (US); John N. Magno, St. James, NY (US)

(73) Assignee: Red Bank Technologies LLC, Red Bank, NJ (US)

( * ) Notice: Subject to any disclaimer, the term of this patent is extended or adjusted under 35 U.S.C. 154(b) by 0 days.

(21) Appl. No.: 16/494,346

(22) PCT Filed: Mar. 23, 2018

(86) PCT No.: PCT/US2018/023976
§ 371 (c)(1),
(2) Date: Sep. 16, 2019

(87) PCT Pub. No.: WO2018/175857
PCT Pub. Date: Sep. 27, 2018

(65) Prior Publication Data
US 2021/0132383 A1    May 6, 2021

Related U.S. Application Data

(60) Provisional application No. 62/475,610, filed on Mar. 23, 2017.

(51) Int. Cl.
*H01L 27/32*      (2006.01)
*G02B 27/01*      (2006.01)

(52) U.S. Cl.
CPC ...... *G02B 27/0172* (2013.01); *H01L 27/3232* (2013.01)

(58) Field of Classification Search
CPC .............. G02B 27/0172; H01L 27/3232
See application file for complete search history.

(56) References Cited

U.S. PATENT DOCUMENTS 9,013,793 B2    4/2015  Gupta et al.
2004/0069995 A1  4/2004  Magno et al.
(Continued)

FOREIGN PATENT DOCUMENTS

WO    2016209797    12/2016
WO    2017156433    9/2017

OTHER PUBLICATIONS

International Search Report Written Opinion for corresponding International Patent Appln. No. PCT/US18/23976 dated Jul. 11, 2018.

*Primary Examiner* — Kevin M Nguyen
(74) *Attorney, Agent, or Firm* — Patterson + Sheridan, LLP

(57) ABSTRACT

Disclosed herein are head-mounted and other display assemblies that utilize organic light emitting diodes as image sources. In the organic light emitting diodes utilized in these display assemblies light is emitted by stimulated emission. As a result of this, the organic light emitting diodes utilized emit light vertically within a narrow cone about axes normal to the planes of the organic light emitting diodes. This narrow cone of emission results in greatly reduced light insertion losses when light transits from the organic light emitting diodes through the display assemblies and as a result increased energy efficiency in the operation of the display assemblies.

15 Claims, 6 Drawing Sheets

(56) References Cited

U.S. PATENT DOCUMENTS

| | | |
|---|---|---|
| 2004/0212603 A1 | 10/2004 | Cok |
| 2005/0194896 A1* | 9/2005 | Sugita .................... B82Y 30/00 |
| | | 313/506 |
| 2011/0164221 A1 | 7/2011 | Tilleman et al. |
| 2015/0205351 A1 | 7/2015 | Osterhout et al. |
| 2017/0090194 A1* | 3/2017 | Hayes ................... G06T 19/006 |
| 2018/0024366 A1* | 1/2018 | Ma ....................... G02B 27/283 |
| | | 345/8 |
| 2019/0157572 A1* | 5/2019 | Koch ................. C09K 19/3857 |

* cited by examiner

Figure 4 — Prior Art

HEAD-MOUNTED AND HEAD-UP DISPLAYS UTILIZING ORGANIC LIGHT EMITTING DIODES THAT EMIT BY STIMULATED EMISSION

CROSS-REFERENCE TO RELATED APPLICATION

This application is a 371 National Stage of International Application No. PCT/US2018/23976, filed Mar. 23, 2018, which was published as International Publication No. WO 2018/175857, and which claims the benefit under 35 U.S.C. § 119(e) of the earlier filing date of U.S. Provisional Patent Application No. 62/475,610 filed on Mar. 23, 2017, the disclosure of which is incorporated by reference herein.

BACKGROUND

Organic light emitting diodes (OLEDs) are a display technology that is finding wide application in microdisplays for head-mounted and other non-direct-view applications. They offer multiple advantages over other technologies including lower power dissipation, low operating voltages, wide operating temperature range, and excellent image quality. However, there are serious drawbacks to conventional OLEDs especially when they are used in applications in which the displayed imagery is overlaid on ambient views of the surrounding real world environment. Applications of this type include augmented reality head-mounted displays and head-up displays.

A serious issue of OLEDs in these applications stems from their light emission properties. Conventional OLEDs are area light emitters rather than point sources and they emit light over a wide angle. The issue that these properties create is illustrated in FIG. 1. This figure portrays two optical assemblies 100 and 150. Assembly 100 comprises a cavity 106 bounded by light absorbing walls 104; an aperture 108 in the cavity walls, and an area emitting, light emitting device 102. Assembly 150 comprises a cavity 156 bounded by light absorbing walls 154; an aperture 158 in the cavity walls; and an area emitting, light emitting device 152. Light emitting devices 102 and 152 emit light uniformly across their entire front surfaces. Assemblies 100 and 150 are identical except that light emitting device 152 is much smaller in area than light emitting device 102, and light emitting device 152 emits collimated light (light is only emitted at an angle perpendicular to the surface e of the device) whereas device 102 emits light over a wide range of angles. It can be seen that most of the light rays 110 in assembly 100 strike the cavity walls and are lost while a small percentage of the rays 112 pass out through the aperture 108. On the other hand, in the case of assembly 150 essentially all the light rays emitted 162 pass out through aperture 158. These admitted extreme examples illustrate that the amount light that passes through an optical assembly usefully will depend on the ratio of the total area of the emitter surface to the area of the aperture emitter surface subtended by the aperture. Further, the amount light that passes through an optical assembly usefully will also depend on the ratio of solid angle into which the light emitting device emits light to the solid angle subtended by the aperture at the emitter surface. (It should be noted that the angular distribution of light in the emission cone of the light emitting device and the uniformity of light distribution over the light emitter's surface will also impact the efficiency of the assembly and real optical systems often have multiple components with multiple apertures and it is not always the first aperture the emitted light encounters that will determine the system efficiency.) What one can conclude from this analysis is that conventional OLEDs will often deliver a low percentage of their emitted light usefully through a multi-component display system because they are area emitters that emit light over a wide range of angles.

This issue with OLEDs can be illustrated in an actual head-mounted display system by referring to FIG. 2 that depicts in cross-section an augmented reality display system 200 described by U.S. patent application Ser. No. 13/510, 423. The system comprises a microdisplay 202; a series of relay mirrors 206, 208, 210, and 212; and a partially silvered combiner mirror 214. In operation an image is portrayed on display 202. Light rays from this image, for example 218 and 220, depart the display and are successively reflected from mirrors 206, 208, 210, and 212. After being reflected from mirror 212 the light rays from the image strike combiner mirror 214 and a portion of them are reflected towards the display wearer's eye 216. The combination of all of the light rays traversing the system from display 202 to the wearer's eye 216 is detected as an image of the displayed data on the wearer's retina. At the same time some portion of light from the surrounding environment (for instance, ray 222) passes through the partially silvered combiner mirror 214, impinges in the display wearer's eye 216 and creates an image of the surrounding environment on the wearer's retina.

A major consideration in designing a head-mounted display such as 200 is balancing the amount of light reaching wearers from the display 202 with the amount of ambient light reaching wearers from their surroundings. When there are high levels of ambient lighting, for instance outdoors, light from the ambient environment can render the imagery from the display undetectable unless either a large amount of light from the display 202 reaches combiner mirror 214 or combiner mirror 214 is designed to reflect a large portion of the light from the display 202 and transmits a small portion of light from the environment. The problem is that in this second case the head-mounted display wearers will not be able to see their surrounding environment well when, for instance, indoors.

Returning to FIG. 2, if microdisplay 202 is a conventional OLED, it will emit light over a large range of angles. However, mirror 206 only subtends angle α at, for instance, point 206. Because of this light rays like 224, 226, and 228 will miss mirror 206 and a small portion of the light from display 202 will enter the optical system and end up at combiner mirror 214. Thus, because conventional OLEDs emit light over a wide cone of angles, they are not good candidates for use in head-mounted display systems.

Conventional OLEDs are not the only light sources that present light throughput issues when used in head-mounted display systems. FIG. 3 depicts a prior art head-mounted display system described in U.S. Pat. No. 9,013,793. The system comprises an illumination module 340, a microdisplay 345 (the patent suggests using liquid crystal on silicon [LCOS] microdisplay), a cavity 305 (defined by the eyeglasses frame in this case), a first polarizing beam splitter 310, a second polarizing beam splitter 315, a cover glass 320, a quarter wave retarder plate 325, a lens 350, and a reflector 355. Unpolarized light from the illumination module 340 encounters the first polarizing beam splitter 310. The beam splitter transmits the P polarized component of the light and reflects the S polarized component. The P polarized component continues onward and encounters reflective display 345. Reflection by the reflective display rotates polarization of the polarized light by ninety degrees yielding S polarized light while at the same time patterning the light with the image to be displayed. The S polarized light again encounters polarizing beam splitter 310 and is reflected down cavity 305 (light ray 303). Ray 303 of S polarized light then encounters the second polarizing beam splitter 315 and is transmitted through it. The S polarized light then passes through quarter wave plate 320 and is converted to circularly polarized light. It then traverses lens 350, is reflected from reflector 355, and re-traverses lens 350. The combination of lens and reflector removes distortions from the image. The circularly polarized light then passes back through quarter wave plate 320 that converts it into P polarized light 304. This light is reflected by polarizing beam splitter to the eye 380 of the individual wearing the head-mounted display system. Light 370 from the ambient environment enters the system and its S polarized component passes through the polarizing beam splitter 315 and enters the eye 380 of the head-mounted display wearer.

In this head-mounted display assembly it is a little more difficult to identify where light losses occur than in example 200 above. In order to gain more insight it is necessary to examine the illumination module 340 in more detail. Detail of the illumination module as presented in U.S. Pat. No. 9,013,793 is depicted in FIG. 4. A lamp (most often an LED or LEDs) emits light into "light expansion zone" 410 that is, in effect, a cavity bounded by reflective walls 415. Like OLEDs, LEDs emit light over a wide cone of angles. The light is reflected multiple times from the reflective walls 415 of the cavity. Since some amount of light is lost with each reflection, a substantial amount of light is lost in this process, if the light emerging from cavity 410 was not further altered in some way, it would still be propagating over a wide range of angles. In order to address this, the light passes through two brightness enhancement films 420 and 425. These films "reduce the angular divergence" of the light exiting the illumination module. That is to say, the light becomes more collimated. However, a substantial amount of light is lost in this process.

In both assemblies 200 and 300 substantial amounts of light are lost in converting light emitted at wide angles into a more collimated beam of light. It turns out that this is a fundamental law of optics related to the second law of thermodynamics. One cannot convert light propagating over a wide range of angles into a more collimated beam of light without incurring a substantial energy (light) loss. This loss may be minimized by good optical design, but cannot be eliminated.

Even with the use of the brightness enhancement films 420 and 425 divergence of the light rays that originally emanate from lamp 405 may still present a problem. To overcome this potential problem paragraph 0024 of U.S. Pat. No. 9,013,793 describes the use of blackout films patterned onto the illumination module 340, the display panel 345, or elsewhere in the cavity formed by eyeglass frame 305. The use of such blackout films will introduce even more light losses into the head-mounted display systems. These and the other light losses described can be tolerated only because LEDs can powered to produce a great deal of light. But, such energy inefficiency can cause other problems such as battery life issues, heating and additional weight It would be highly beneficial to utilize a light or image source that produces collimated light intrinsically.

Returning to FIG. 4, after passing through brightness enhancement films 420 and 425 the light passes through linear polarizer 430. This polarizer transmits the P polarization of light from illumination module 340 but absorbs the S polarization that would otherwise be reflected from the surface of polarizing beam splitter 310. The polarizing beam splitters are used in an augmented reality head-mounted display system like 300 because the brightness of the image from the display panel 345 can adjusted independently of the perceived image of the ambient environment. Balancing the brightness of the displayed images and the light from the ambient environment can be achieved more efficiently. However, the drawback of this approach is that polarizer 430 absorbs more than half of the light incident on it still further reducing the energy efficiency of the display system.

DETAILED DESCRIPTION

Figure 5:
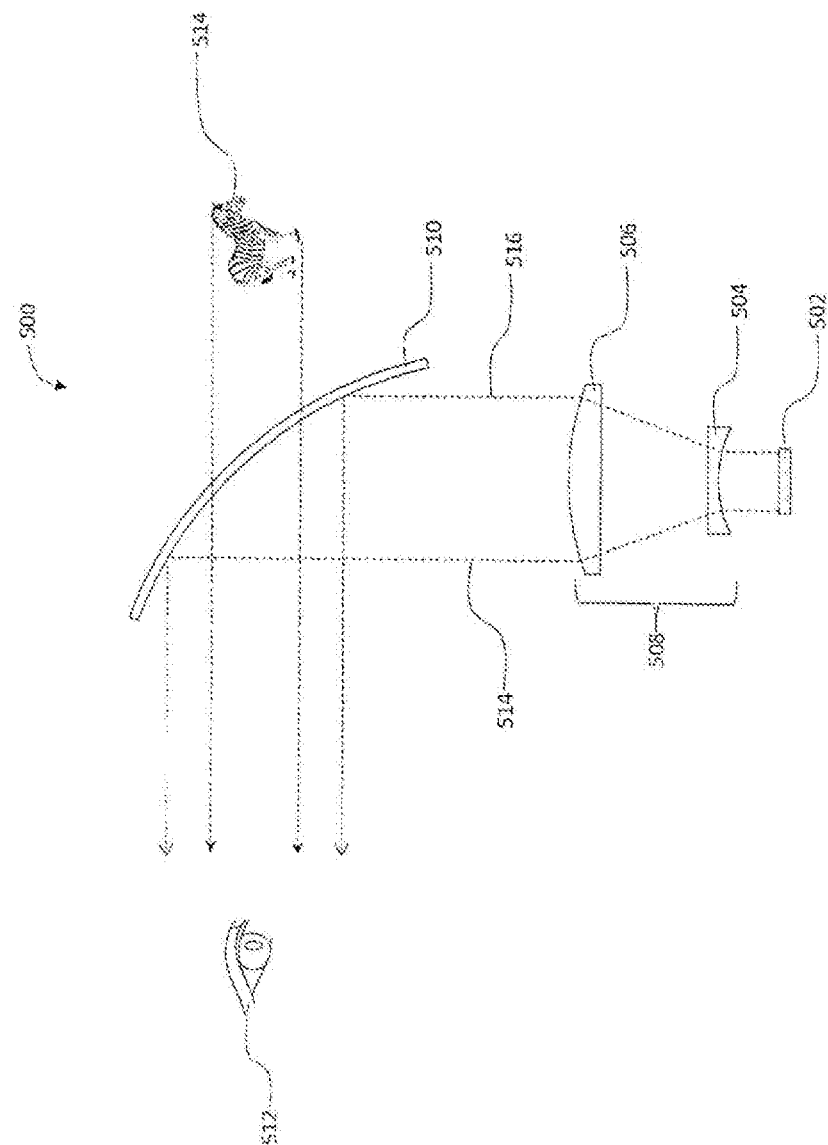
FIG. 5 illustrates a display assembly of the invention.

An embodiment 500 of the invention is depicted in FIG. 5. Display assembly 500 comprises an OLED display panel 502 that emits light through stimulated emission. OLEDs of this type are described in U.S. patent application Ser. No. 10/434,941, International Patent Application PCT/US2016/038479, and International Patent Application PCT/US17/21867. OLEDs described in these three patent applications have the common feature that photons emitted by the electroluminescent materials in the devices are emitted in directions perpendicular to the plane of the devices are retained in the devices resulting in high photon densities in the electroluminescent materials of the OLEDs. These photons stimulate further emission of photons that propagate in the same vertical directions such that nearly all light emitted by the OLEDs is emitted through stimulated emission. Also, since all the light emitted through stimulated emission is emitted vertically, the light emitted by the devices is emitted in a narrow cone of angles about the normal to the OLEDs' surfaces.

The head-mounted display system 500 also comprises an image modification assembly 508, and an image combiner 510. In the embodiment 500 of the invention shown in FIG. 5. The image modification assembly comprises two lenses 504 and 506. This assembly serves to magnify the image produced by display panel 502, but it may have other uses such as compensating for distortions of the image from display panel 502 introduced by image combiner 510. In the embodiment 500 shown in FIG. 5 the image modification assembly 508 utilizes two lenses 504 and 506, but alternatively the image modification may be accomplished by some number of mirrors or a combination of mirrors and lenses. In many applications it may be necessary to "fold" the light path between display panel 502 and image combiner 510 so as to more easily fit the head-mounted or head-up display assembly into a compact volume. In these cases fold mirrors may also constitute part of image modification assembly 508.

Because the display panels 502 used in embodiment 500 emit light in a narrow cone of angles about the normal to the display panel's surface, nearly all the light emitted lies between light rays 514 and 516 shown in FIG. 5. As a result nearly all the light produced by OLED 502 passes through the aperture or entrance pupil of mirror 504 and eventually out through the exit pupil of image modification assembly 508. As a result, much more light reaches image combiner 510 and is reflected to the eye 512 of the display system user. Because much more light is available through the optical system from OLED 502 as compared to a conventional OLED, combiner mirror 510 may be designed to reflect a much lower percentage of light from OLED 502 and to transmit more light from the ambient scene 514. Thus the head-mounted or head-up display assembly 500 becomes practical for use in a wide range of ambient lighting conditions. Display systems of this type may also be used on non-head-mounted applications such as head-up displays for aircraft and vehicle windscreens.

Figure 6:
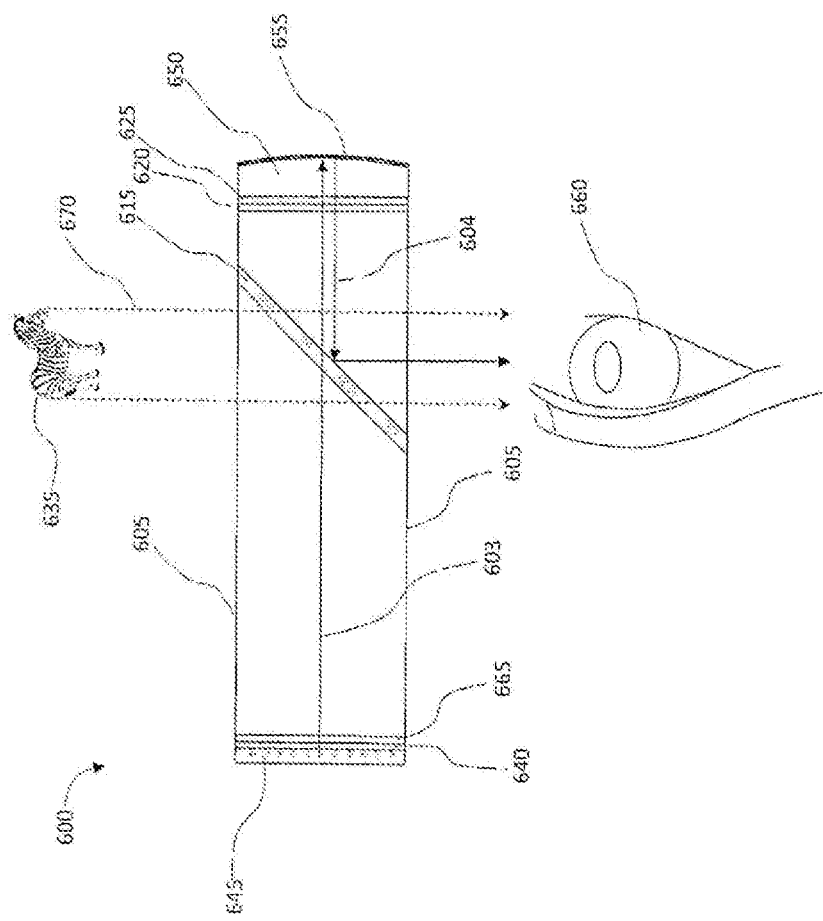
FIG. 6 illustrates another display assembly of the invention.

Another embodiment 600 of the invention is depicted in FIG. 6, This head-mounted display system 600 comprises a chiral band-edge emission enhanced organic light emitting diode (C-OLED) display panel 645 like those described in International Patent Application PCT/US17/21867, a first quarter wave optical retarder plate 640, a first cover glass 665, a cavity bounded by walls 605, a polarizing beam splitter 615, a second cover glass 620, a second quarter optical retarder wave plate 625, a lens 650, and a reflector 655. When head-mounted display system 600 is activated, C-OLED emits and image in the form of circularly polarized light. This light is converted to linearly polarized light by first quarter wave optical retarder plate 640 and then is transmitted out through first cover glass 665. The light 603 traverses the cavity bounded by walls 605 and encounters polarizing beam splitter 615. Light 603 has a linear polarization that is transmitted by polarizer beam splitter 615 passing through it to second cover glass 620. Light 603 passes through second cover glass 620 and into second quarter wave optical retarder plate 625. The second quarter wave optical retarder plate 625 converts linearly polarized light 603 into circularly polarized light. This light passes through lens 650, is reflected from reflector 655, and passes back out through lens 650. The circularly polarized light leaving lens 650 once again encounters second quarter wave optical retarder plate 625 and is converted to linearly polarized light 604 that passes out through second cover glass 620. Linearly polarized light 620 has its polarization axis rotated ninety degrees from the linear polarization axis of light 603. As such, it is reflected from polarizing beam splitter 615 and exits the head-mounted display system 600 to the eye 660 of the display system user. The image formed on OLE) display panel 645 is duplicated on the retina of the display system user. Light 670 from the ambient scene 635 encounters polarizing beam splitter 615 and one plane polarized component of that light passes through beam splitter 615 to the display system user's eye 660.

Figure 1:
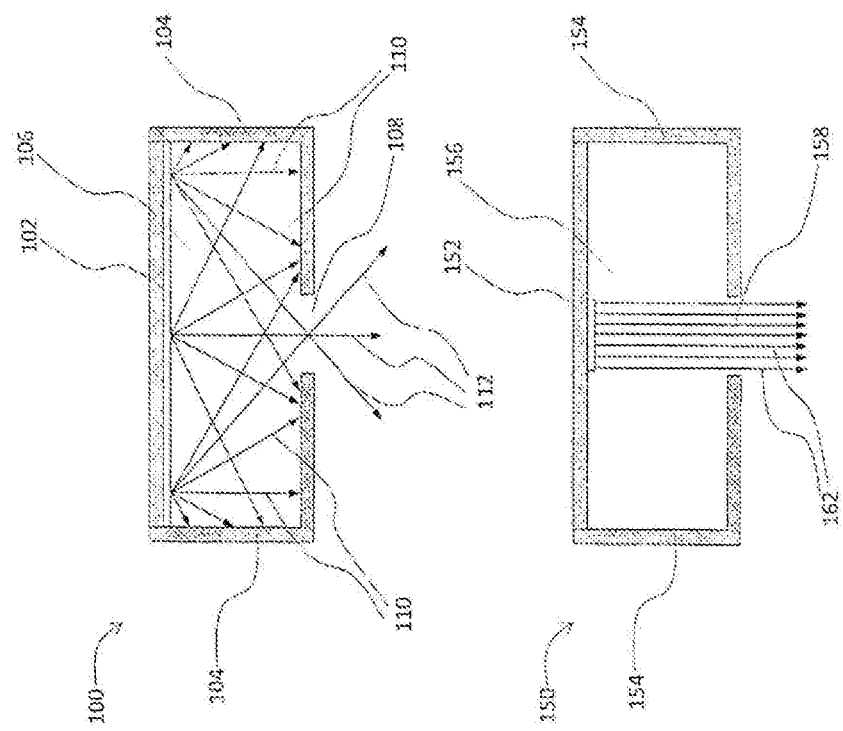
FIG. 1 illustrates in a general way the effect of the degree of collimation of a light source on the light throughput of an optical system.
Figure 2:
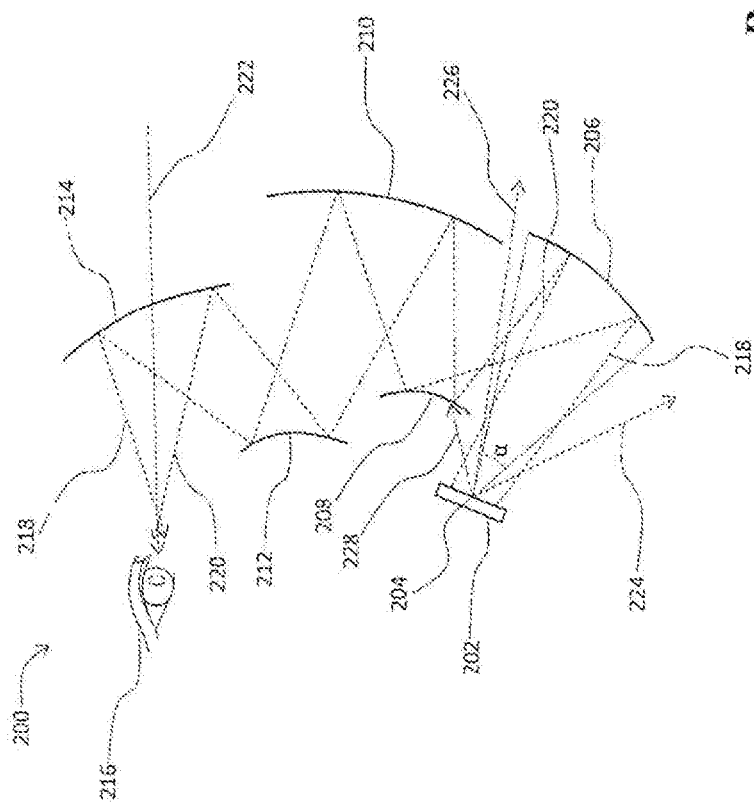
FIG. 2 illustrates a prior art head-mounted display system.
Figure 3:
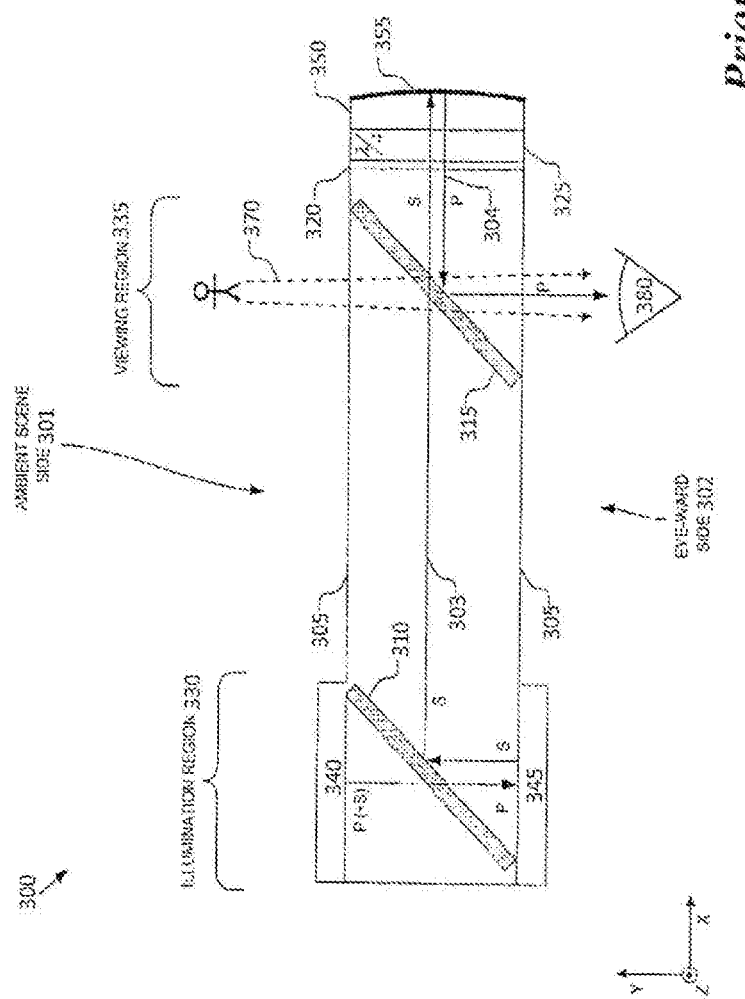
FIG. 3 illustrates another prior art head-mounted display system.
Figure 4:
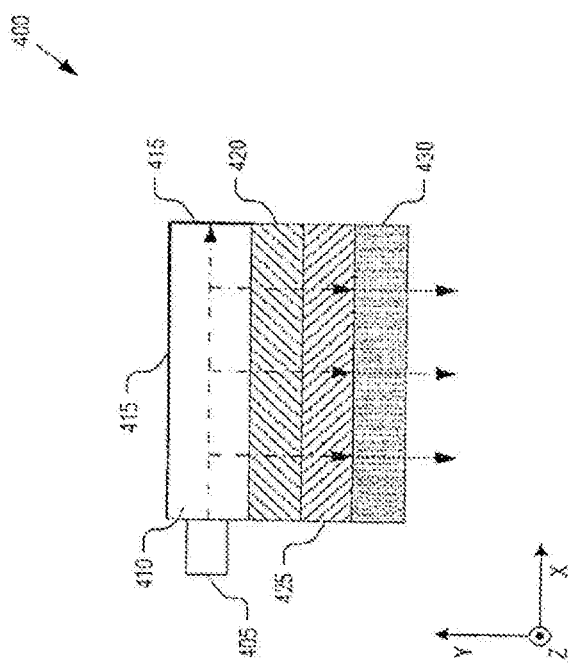
FIG. 4 illustrates a prior art illumination module used in a head-mounted display system.

It can be seen by comparing FIG. 6 to FIG. 3 that C-OLED display panel 645 and first quarter wave optical retarder plate 640 replace illumination module 340, display panel 315, and polarizing beam splitter 345. Thus several components are replaced by two components considerably reducing parts count in the head mounted display system. Furthermore the light losses associated with illumination module 340 are eliminated. As described by U.S. Provisional Patent Application 62/306,128. C-OLEDs are extremely energy efficient light emitters (over 300 lumens per watt at some wavelengths) and they emit light over a narrow cone angles around the normal the display surface. Thus light loses on the walls 605 of the cavity are minimized. Because C-OLED 645 emits circularly polarized light that be converted to linearly polarized light by first quarter wave optical retarder plate 640 with essentially no light loss, the large loss of light due to linear polarizer 430 in FIG. 4 is also eliminated. As a result, head-mounted display system 600 is able to deliver a much higher amount of light to the display user's eyes with considerably less power dissipation.

What is claimed is:

1. A display system that overlays electronically generated images over physical real world views wherein the display system comprises:
   a chiral band-edge emission enhanced organic light emitting diode;
   and further comprises an optical combiner that overlays the light emitted by the organic light emitting diode with ambient light from the display system surroundings.

2. The display system of claim 1 wherein the display system further comprises at least one polarizing beam splitter.

3. The display system of claim 2 wherein the chiral band-edge emission enhanced organic light emitting diode emits circularly polarized light.

4. The display system of claim 1 wherein the combiner comprises a partially reflective and partially transmissive mirror.

5. The display system of claim 1 wherein the display system is a head-mounted display system.

6. The display system of claim 1 wherein the display system is a head-up display system.

7. The display system of claim 1, wherein the chiral band-edge emission enhanced organic light emitting diode emits light that is over ninety percent generated by stimulated emission.

8. A head-mounted display system that comprises:
   a chiral band-edge emission enhanced organic light emitting diode;
   and further comprises at least one mirror that projects graphic information from the organic light emitting diode to at least one eye of a head-mounted display wearer.

9. The display system of claim 8, further comprising at least one mirror that projects graphic information from the chiral band-edge emission enhanced organic light emitting diode to at least one eye of a head-mounted display wearer.

10. The head-mounted display system of claim 9, wherein the chiral band-edge emission enhanced organic light emitting diode emits circularly polarized light.

11. The head-mounted display system of claim 8, wherein the chiral band-edge emission enhanced organic light emitting diode emits circularly polarized light.

12. The display system of claim 8, wherein the chiral band-edge emission enhanced organic light emitting diode emits light that is over ninety percent generated by stimulated emission.

13. A head-mounted display system that comprises:
   a chiral band-edge emission enhanced organic light emitting diode;
   and further comprises at least one lens that projects graphic information from the organic light emitting diode to at least one eye of a head-mounted display wearer.

14. The head-mounted display system of claim 13, wherein the chiral band-edge emission enhanced organic light emitting diode emits circularly polarized light.

15. The display system of claim 13, wherein the chiral band-edge emission enhanced organic light emitting diode emits light that is over ninety percent generated by stimulated emission.

* * * * *